(12) United States Patent
Chao et al.

(10) Patent No.: US 9,754,895 B1
(45) Date of Patent: Sep. 5, 2017

(54) METHODS OF FORMING SEMICONDUCTOR DEVICES INCLUDING DETERMINING MISREGISTRATION BETWEEN SEMICONDUCTOR LEVELS AND RELATED APPARATUSES

(71) Applicant: Micron Technology, Inc., Boise, ID (US)

(72) Inventors: Yang Chao, Boise, ID (US); Joseph L. Hess, Meridian, ID (US); Keith E. Ypma, Boise, ID (US); Kurt J. Bossart, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/062,452

(22) Filed: Mar. 7, 2016

(51) Int. Cl.
G02F 1/1333 (2006.01)
H01J 9/20 (2006.01)
(Continued)

(52) U.S. Cl.
CPC ............ *H01L 23/544* (2013.01); *G06T 7/001* (2013.01); *G06T 7/0042* (2013.01); *G06T 11/20* (2013.01);
(Continued)

(58) Field of Classification Search
CPC ......... G02F 1/1303; G02F 2001/13478; G02F 1/1347; G02F 2001/133354; H01L 21/682;
(Continued)

(56) References Cited

U.S. PATENT DOCUMENTS 3,783,520 A 1/1974 King
5,696,835 A 12/1997 Hennessey et al.
(Continued)

FOREIGN PATENT DOCUMENTS

WO 2004090980 A2 10/2004

OTHER PUBLICATIONS

Adel et al., Optimized Overlay Metrology Marks: Theory and Experiment, IEEE Transactions on Semiconductor Manufacturing, vol. 17, No. 2, May 2004, pp. 166-179.
(Continued)

*Primary Examiner* — Evan Pert
*Assistant Examiner* — Changhyun Yi
(74) *Attorney, Agent, or Firm* — TraskBritt

(57) ABSTRACT

A method of determining a lateral misregistration between levels of a semiconductor structure comprises imaging at least one first alignment mark in a first level of the structure and at least one second alignment mark in a second level of the structure. A digital image of the first and second alignment marks is formed, each of which are defined by a set of points having an x-value and a y-value. The x-values and y-values of points defining the first alignment mark and points defining the second alignment mark are averaged to determine a center of the first alignment mark and a center of the second alignment mark. An x-coordinate and a y-coordinate of the center of the first alignment mark is subtracted from the respective x-coordinate and y-coordinate of the center of the second alignment mark to determine a lateral misregistration between the first level and the second level. Related methods of forming a semiconductor wafer, semiconductor assembles and metrology tools for use in implementing the methods are disclosed.

25 Claims, 7 Drawing Sheets

(51) Int. Cl.
*H01L 23/544* (2006.01)
*G06T 7/00* (2017.01)
*G06T 11/20* (2006.01)
*H01L 21/66* (2006.01)
*H01L 23/48* (2006.01)
*H01L 21/67* (2006.01)
*H01L 21/68* (2006.01)
*H01L 25/00* (2006.01)
*H01L 25/065* (2006.01)

(52) U.S. Cl.
CPC ...... *H01L 21/67259* (2013.01); *H01L 21/681* (2013.01); *H01L 22/20* (2013.01); *H01L 23/481* (2013.01); *H01L 25/0657* (2013.01); *H01L 25/50* (2013.01); *G06T 2207/30148* (2013.01); *H01L 2223/5442* (2013.01); *H01L 2223/54426* (2013.01); *H01L 2225/06513* (2013.01); *H01L 2225/06517* (2013.01); *H01L 2225/06541* (2013.01)

(58) Field of Classification Search
CPC .. H01L 23/544; H01L 2224/767–2224/76756; H01L 2223/54426; B81C 99/007
USPC ................................. 349/158; 438/745, 748
See application file for complete search history.

(56) References Cited

U.S. PATENT DOCUMENTS

| | | | |
|---|---|---|---|
| 5,998,226 A | 12/1999 | Chan | |
| 6,043,134 A | 3/2000 | Bishop | |
| 6,118,185 A | 9/2000 | Chen et al. | |
| 6,228,743 B1 | 5/2001 | Chen et al. | |
| 6,266,144 B1 | 7/2001 | Li | |
| 6,297,876 B1 | 10/2001 | Bornebroek | |
| 6,586,143 B1 | 7/2003 | Tan et al. | |
| 6,603,529 B1 | 8/2003 | Finarov | |
| 6,730,444 B2 | 5/2004 | Bowes | |
| 6,908,775 B2 | 6/2005 | Heine et al. | |
| 6,948,149 B2 | 9/2005 | Goodwin | |
| 7,095,885 B1 | 8/2006 | DeLaRosa et al. | |
| 7,180,593 B2 | 2/2007 | Lin | |
| 7,333,219 B2 | 2/2008 | Yu et al. | |
| 7,879,627 B2 | 2/2011 | Ghinovker et al. | |
| 7,879,682 B2 | 2/2011 | Van Haren et al. | |
| 8,706,442 B2 | 4/2014 | Mos et al. | |
| 8,717,539 B2 | 5/2014 | Ziger | |
| 8,781,211 B2 | 7/2014 | Ghinovker | |
| 9,093,458 B2 | 7/2015 | Amir et al. | |
| 9,097,989 B2 | 8/2015 | Ausschnitt et al. | |
| 9,222,834 B2 | 12/2015 | Den Boef | |
| 2005/0097764 A1 | 5/2005 | Kim | |
| 2006/0042106 A1 | 3/2006 | Smith et al. | |
| 2007/0195326 A1 | 8/2007 | Fujimoto | |
| 2010/0002183 A1* | 1/2010 | Fukuda | G02F 1/1303 349/158 |
| 2013/0342831 A1 | 12/2013 | Levinski et al. | |
| 2015/0323471 A1 | 11/2015 | Sapiens et al. | |
| 2016/0003735 A1* | 1/2016 | Seligson | G03F 7/70633 356/402 |

OTHER PUBLICATIONS

63152J/3.155J—Microelectronics Processing Technology, Lithography Lecture # 1, Spring Term 2005, Lecture 09, 17 pages.
UCR-EE136 Semiconductor Device Poessing, Photolithography-II, Spring 2008-Lecture 4, 26 pages.

* cited by examiner

METHODS OF FORMING SEMICONDUCTOR DEVICES INCLUDING DETERMINING MISREGISTRATION BETWEEN SEMICONDUCTOR LEVELS AND RELATED APPARATUSES

TECHNICAL FIELD

Embodiments disclosed herein relate to methods and systems for determining misregistration between at least a first level and at least a second level of a structure. More particularly, embodiments of the disclosure relate to methods and apparatuses for estimating a lateral misregistration between levels of a structure and to methods of forming semiconductor structures using such methods.

BACKGROUND

Fabrication of semiconductor wafers includes, among other process acts, sequential acts of forming a photoresist material to be patterned on a surface of a semiconductor wafer, exposing portions of the photoresist material to electromagnetic radiation to transfer a pattern of a reticle (i.e., a mask) to the photoresist material, and developing the exposed photoresist material to produce the image of the reticle on the wafer. The reticle includes a pattern of radio-opaque and radio-transmissive areas that may define features of the circuit pattern when transferred to the wafer.

Each level of the semiconductor wafer may be aligned to the previously formed and patterned levels. Conventionally, special alignment patterns may be designed on each level of the semiconductor wafer to align the wafer to the reticle or to measure a lateral misregistration between adjacent levels of the wafer. During photolithography processes, the pattern on the reticle is aligned with the pattern on a surface of the wafer underlying the photoresist material to be patterned.

Relatively small errors in the lateral positioning of features of adjacent levels of the semiconductor wafer may result in an ineffective semiconductor device fabricated from the wafer. For example, relatively small errors in positioning of an access line relative to a conductive via can cause the conductive via to be offset from the access line or to contact the line over a surface area that is insufficient to provide adequate conductivity for a fully functional circuit. In addition, relatively small errors may be compounded in the case of stacked, so-called three-dimensional semiconductor devices, such as hybrid memory cubes comprising a stack of memory dice on a logic dice.

Overlay accuracy generally refers to how accurately a first patterned level of a wafer aligns with respect to a second patterned level of the wafer disposed above or below the first patterned level. Misregistration refers to an amount of lateral offset between one or more levels of the wafer and one or more other levels of the wafer. By way of nonlimiting examples, misregistration may refer to a lateral offset between one semiconductor die in a stack of semiconductor dice relative to other semiconductor dice in the stack, or between features on or in different levels of a semiconductor structure, such as a semiconductor wafer or die. Accuracy of the misregistration measurement in terms of magnitude and direction is still one of the major challenges faced by the overlay metrology in advanced integrated circuits.

Previous methods of measuring the misregistration include the so called "box-in-box" method wherein a target including a pair of concentric boxes (i.e., squares) are formed in scribe lines of the wafer. A location of the edges of each box is determined with, for example, an optical microscope waveform or a scanning electron microscope (SEM) waveform. The overlay error is calculated by estimating a location of the edges of each box with the waveform, determining a distance between relative edges of an inner box and an outer box, and calculating each of the horizontal offset and vertical offset. Other examples of overlay targets include the so called "bar-in-bar" target which includes pairs of parallel bars on successive layers of the wafer.

Unfortunately, such conventional methods of measuring lateral misregistration are prone to errors. Errors in the measurement may be introduced by, for example, insufficient imaging of an entire edge of each box, thick photoresist materials, insufficient contrast between patterns on the wafer, or a nonuniform wafer surface topography. In such situations, current methods of measuring a misregistration are not capable of measuring the misregistration with sufficient accuracy. In some cases, the measured misregistration employing such methods is greater than the actual lateral offset in the wafer, giving a manufacturer a false indication that the tested wafer is not within manufacturing tolerances.

DETAILED DESCRIPTION

Figure 1A:
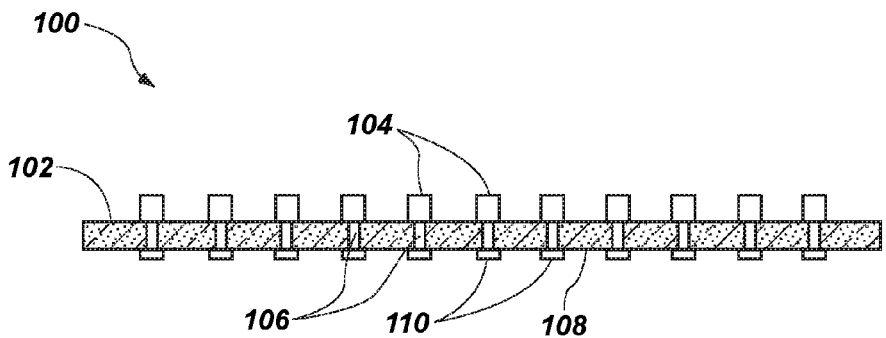
FIG. 1A is a simplified cross-sectional view of a semiconductor die, according to an embodiment of the disclosure.

The illustrations included herewith are not meant to be actual views of any particular systems or semiconductor wafers, but are merely idealized representations that are employed to describe embodiments herein. Elements and features common between figures may retain the same numerical designation.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of an overlay metrology tool, a complete process flow for stacking semiconductor dice, fabricating dice on semiconductor wafers, or for determining a misregistration of adjacent levels of a semiconductor wafer. The semiconductor wafers and semiconductor die stacks described below do not form complete semiconductor devices. Only those process acts and structures necessary to understand the embodiments described herein are described in detail below. Additional acts to form a complete die stack, fabricate a semiconductor wafer, as well as additional components of a metrology tool may be provided by conventional techniques.

As used herein, the term "wafer" means and includes a volume of semiconductor material in the form of a bulk semiconductor substrate and is not limited to conventional, substantially circular wafers.

As used herein, the term "structure" means and includes a wafer or a portion, feature, or component of a wafer, such as a memory cell in an array of memory cells, a portion of a memory cell, electrical connections (e.g., a bond pad, a conductive pillar, a conductive ball, etc.), and further includes segments of wafers comprising multiple semiconductor dice, singulated semiconductor dice, and assemblies such as stacks of semiconductor dice.

As used herein, the term "level" means and includes a portion of a structure in or on which one or more features, such as conductive structures, bond pads, conductive pillars, conductive balls, integrated circuitry, or combinations thereof are formed. In some embodiments, a level may refer to an individual semiconductor die in a stack of semiconductor dice. In other embodiments, a level may refer to a portion of an individual die that may include a portion of a memory cell, such as a portion of one or more of a gate, transistor, capacitor, transistor, etc.

Fabrication of a semiconductor wafer or a semiconductor wafer package includes foil ling successive levels of features on the semiconductor wafer, each feature level comprising components of circuitry (e.g., transistors, capacitors, access lines, gate structures, etc.) that is aligned with circuitry components on adjacent levels of the wafer. A completed semiconductor die assembly or semiconductor die stack includes successive levels of semiconductor dice stacked one over the other and with features, such as conductive vias, bond pads, conductive pillars, etc., vertically aligned. If electrically conductive features of one semiconductor die are not aligned with electrically conductive features on an adjacent semiconductor die, the stack of semiconductor dice may be partially or totally inoperable. For example, where the electrically conductive features are misaligned, sufficient electrical connections may not be formed between adjacent levels, or semiconductor dice of the stack, for power, ground and/or signal connections.

According to embodiments described herein, a method of measuring a lateral misregistration (i.e., a misalignment or an overlay error) between one or more levels of a semiconductor wafer and one or more other levels of the semiconductor wafer is described. The wafer includes at least a first level including at least one first shape for which a center can be determined by averaging coordinates of points that define the first shape and at least a second level including at least a second shape for which a center can be determined by averaging coordinates of points that define the second shape. In some embodiments, the first shape comprises a circle and the second shape comprises another circle having a smaller diameter than the first shape. In other words, the first shape and the second shape comprise an outer circle and an inner circle, respectively. The wafer, including the first shape and the second shape is imaged and a digital image thereof is formed using digital image processing. Each shape is defined with a set of data points (e.g., pixels), each data point defined by a set of coordinates. The center coordinates of each shape are determined by averaging the coordinates of the points that define the shape. The lateral misregistration is determined by calculating the difference between the center of the first shape and the center of the second shape. In some embodiments, the lateral misregistration is input into a programming recipe of a photolithography tool, such as a stepper, to adjust a position of a wafer stage during photolithography processes.

FIG. 1A is a simplified cross-sectional view of a semiconductor die 100 that may comprise a semiconductor memory die. The semiconductor die 100 may include integrated circuitry on a front, also characterized as an "active" side 102 thereof on which a plurality of electrically conductive elements 104 (e.g., conductive pillars) are formed. The electrically conductive elements 104 may be formed over vias (TSVs) 106 that extend from the front side 102 to a back side 108 of the semiconductor die 100. The TSVs 106 may terminate on the back side 108 on conductive pads 110 (e.g., bond pads, under bump metallization (UBM) pads, etc.). The conductive pads 110 may be located to align with the TSVs 106 extending through the semiconductor die 100 and with the electrically conductive elements 104 on the front side 102 of the semiconductor die 100. Improper alignment of any of the electrically conductive elements 104, the TSVs 106, or the conductive pads 110 with respect to each other may result in ineffective transfer of electronic signals from the front side 102 to the back side 108 of the semiconductor wafer 100.

Figure 1B:
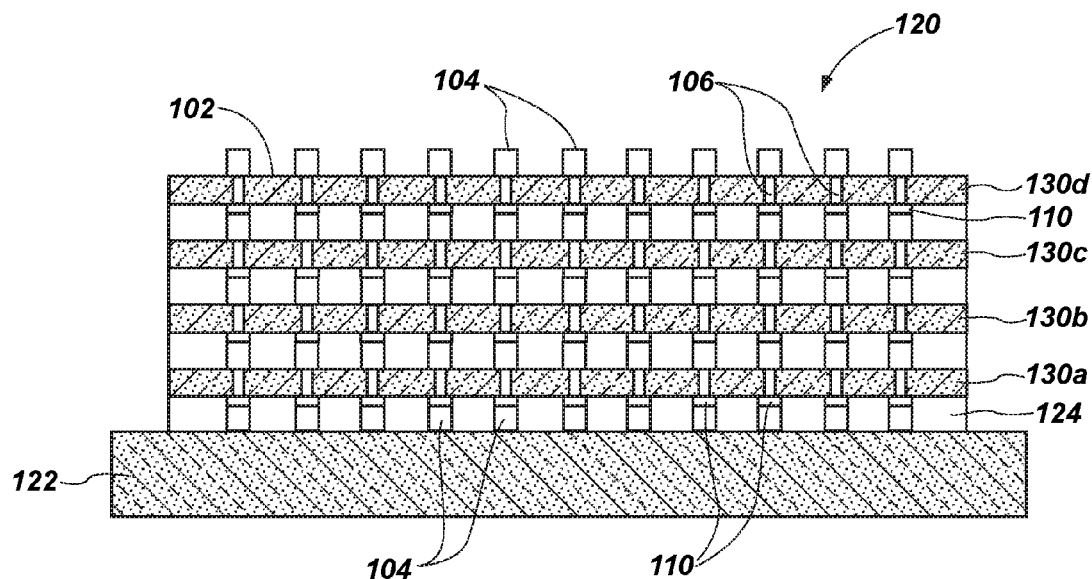
FIG. 1B is a simplified cross-sectional view of a semiconductor die assembly, according to an embodiment of the disclosure.

FIG. 1B is a simplified cross-sectional view of a semiconductor die assembly 120 that comprises a plurality of semiconductor dice 130a, 130b, 130c, 130d stacked one over the other on a substrate 122, which may comprise a wafer segment or a carrier substrate. A wafer level underfill material 124 (WLUF) may substantially fill the volume between adjacent dice of the semiconductor dice 130a, 130b, 130c, 130d. A conductive pad 110 on a back side 108 of one semiconductor die 130b, 130c, 130d may be in electrical communication with an electrically conductive element comprising a pillar 104 on the front side 102 of another semiconductor die 130a, 130b, 130c, 130d.

Figure 1C:
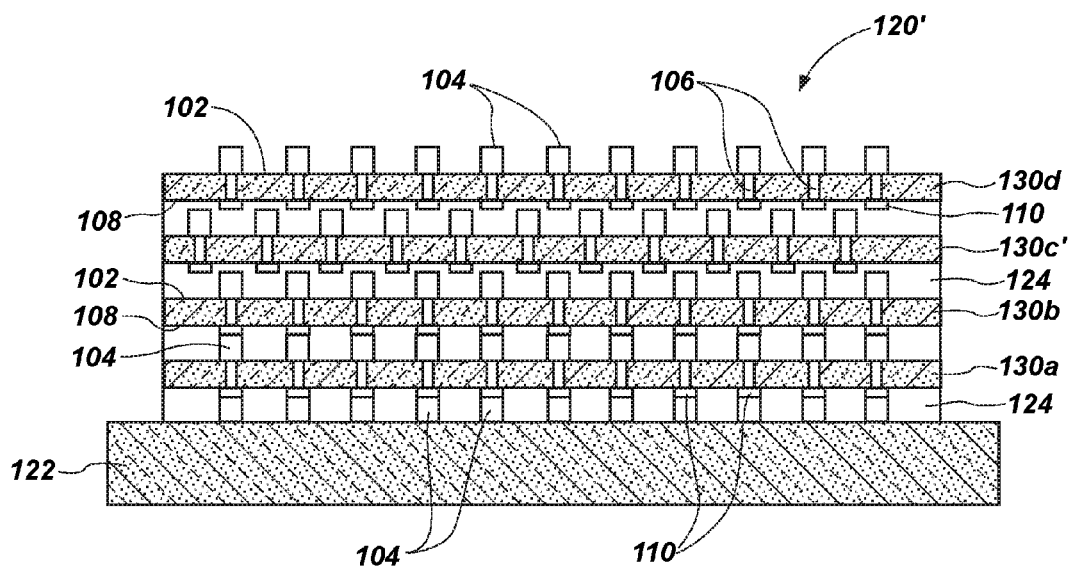
FIG. 1C is a simplified cross-sectional view of a semiconductor die assembly including a misaligned semiconductor die.

During fabrication of the semiconductor die assembly 120, proper alignment of one semiconductor die 130a, 130b, 130c, 130d to another, adjacent semiconductor die 130a, 130b, 130c, 130d is desired to maintain electrical communication and continuity through the stacked die assembly. If one or more of the semiconductor dice 130a, 130b, 130c, 130d are improperly vertically aligned to one another, power or ground, and/or data signals, may not be sufficiently transmitted through the stacked die package and the semiconductor die assembly 120 may not function properly. For example, with reference to FIG. 1C, a semiconductor die assembly 120' including a misaligned semiconductor die 130c' is illustrated, the lateral misalignment being greatly exaggerated for clarity. Electrical power, ground, or data signals may not be communicated between semiconductor die 130d through the misaligned semiconductor die 130c' to the semiconductor dice 130b, 130a. In some embodiments, where the semiconductor stack is coupled to, for example, a logic die or a SoC die, power or data signals may not be sufficiently transmitted to and from the wafer to the logic die or SoC die because of the misaligned semiconductor die 130c'.

Figure 1D:
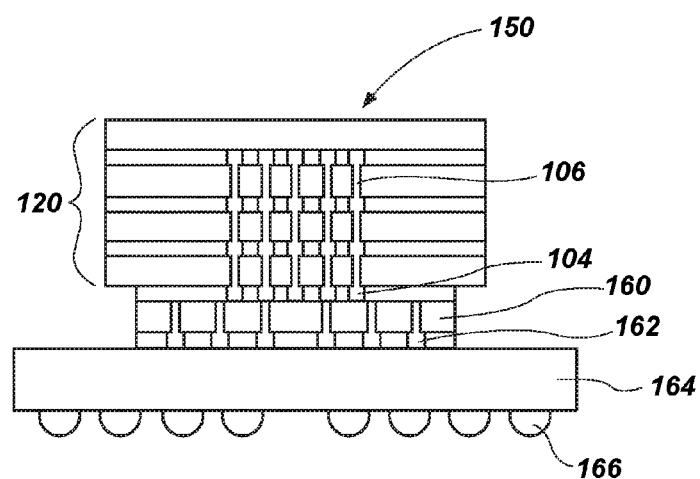
FIG. 1D is a simplified cross-sectional view of a semiconductor device package, according to an embodiment of the disclosure.

FIG. 1D is a simplified cross-sectional view of a semiconductor device package 150 including the semiconductor die assembly 120, as described above with reference to FIG. 1B. The semiconductor die assembly 120 may be electrically connected to a logic die or SoC die 160 with electrically conductive elements 104. Other conductive elements 162 may be coupled to electrical components (e.g., conductive traces) of a carrier substrate 164, such as a ball grid array (BGA) substrate, having conductive elements 166 extending therefrom. The conductive elements 166 may comprise, for example, solder balls, and may be configured for coupling to higher level packaging (e.g., such as to a printed circuit board (PCB)).

Accordingly, in each stage of assembling semiconductor die assembly 120 (FIG. 1B), or the semiconductor device package 150 (FIG. 1D) it is desired to align electrically conductive elements on one level of the respective die, wafer, or device package to other, cooperative electrically conductive elements therein. In addition, it is desired to align components and subcomponents of active circuitry (e.g., transistors, capacitors, access lines, gate structures, etc.) to each other during fabrication of the semiconductor die 100 (FIG. 1A).

Accordingly, in some embodiments, a relative lateral offset, or misregistration, between one or more levels (e.g., one or more of the individual dice 130a, 130b, 130c, 130d) of the semiconductor die assembly 120 and one or more other levels (e.g., one or more of the other individual dice 130a, 130b, 130c, 130d) of the semiconductor die assembly 120 may be measured. Each level of the semiconductor die assembly 120 may include one or more alignment marks that may be used by a metrology tool to determine a magnitude and direction of misregistration. In some embodiments, the one or more alignment marks may be used to align a semiconductor wafer during a sequence of photolithography operations, such as during formation of one or more of the electrically conductive elements 104, the TSVs 106, or conductive pads 110.

Figure 2:
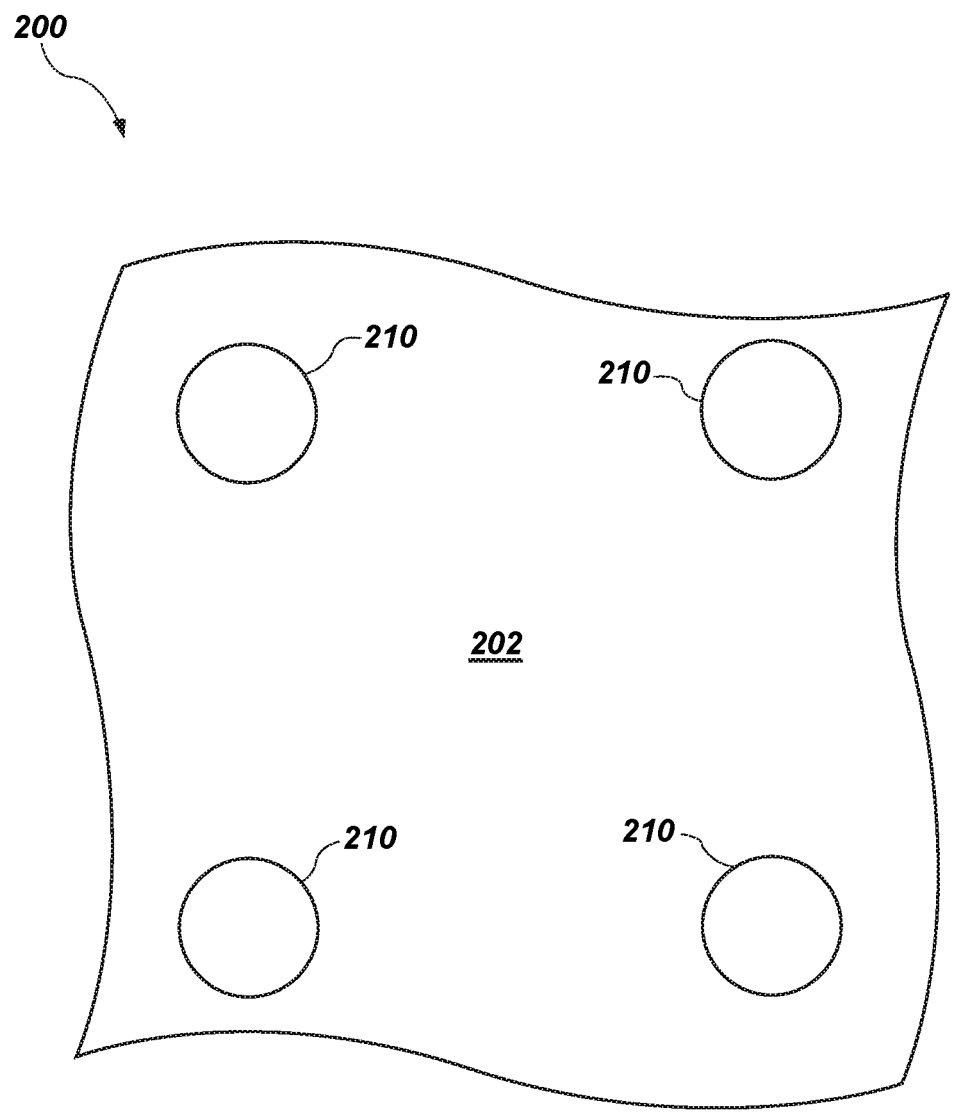
FIG. 2 is a plan view of a portion of a semiconductor wafer including alignment marks, according to an embodiment the disclosure.

FIG. 2 is a simplified plan view of a portion of a semiconductor wafer 200 including one or more alignment marks 210 as may be viewed in a field of view of a metrology tool (e.g., the field of view of an imaging tool, such as a camera) or a photolithography tool (e.g., an exposure field of a reticle). The alignment marks 210 may be fainted at any location 202 on the wafer 200. In some embodiments, the alignment marks 210 are disposed on the wafer 200 at locations 202 without active circuitry, such as on or proximate scribe lines between adjacent die locations or on peripheral areas of the wafer 200 having no die locations. In other embodiments, the alignment marks 210 are disposed at active regions of the wafer 200, such as proximate one or more TSVs 106 of semiconductor dice 130a, 130b, 130c, 130d (FIG. 1B). In yet other embodiments, at least some alignment marks 210 are disposed at inactive regions of the wafer 200 and at least some alignment marks 210 are disposed at active regions of the wafer 200. Although the alignment marks 210 in FIG. 2 are shown at only four locations on the wafer 200, the wafer 200 may include alignment marks 210 at more or fewer locations.

Figure 3A:
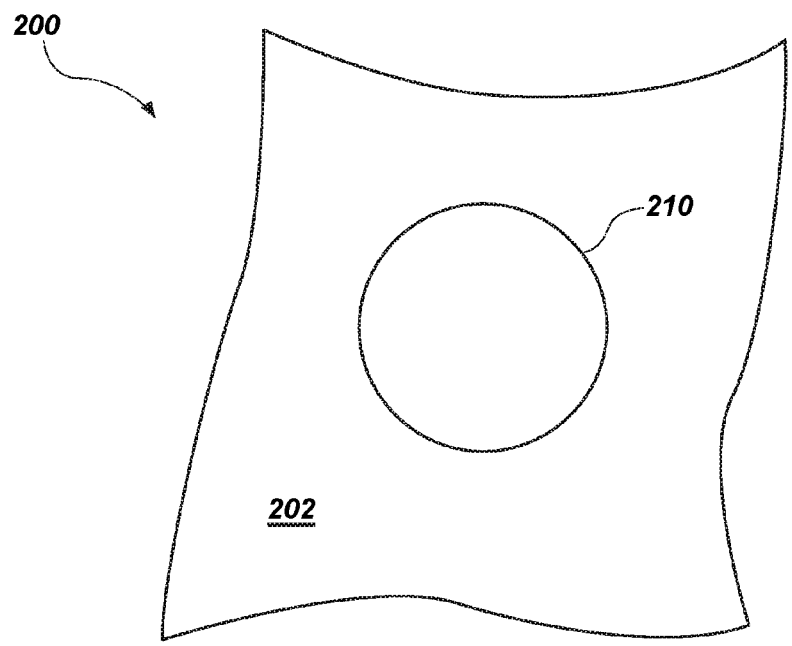
FIG. 3A through FIG. 3D are plan views of a portion of a semiconductor wafer including one or more alignment marks, according to an embodiment of the disclosure.

FIG. 3A is a simplified plan view of a portion of the wafer 200 including a first alignment mark 210 formed on a first level of the wafer 200. Although the illustrated first alignment mark 210 is circular, the first alignment mark 210 may include any shape for which a center can be calculated, as will be described herein. In some embodiments, the first alignment mark 210 includes a shape that is symmetric about a center thereof, although the disclosure is not so limited. By way of nonlimiting example, the first alignment mark 210 may include a circle, an ellipse, an oval, or a polygon, such as a square, a rectangle, a pentagon, a hexagon, a heptagon, an octagon, a nonagon, a decagon, etc. In other embodiments, the first alignment mark 210 may include shapes that are asymmetric about a center thereof.

The first alignment mark 210 may be formed at a known location on the wafer 200. For example, the first alignment mark 210 may be formed at a known distance and orientation relative to, electrically conductive elements of the wafer 200, such as, for example, a TSVs 106 (FIG. 1A, FIG. 1B), electrically conductive elements 104 (FIG. 1A, FIG. 1B), conductive pads 110 (FIG. 1A, FIG. 1B), or to active circuitry features, such as one or more of transistors, capacitors, access lines, or gate structures on the first level of the wafer 200. In some embodiments, the first alignment mark 210 may be formed on a scribe line of the wafer 200. In other embodiments, the first alignment mark 210 may be formed proximate one or more electrically conductive elements of the wafer 200. In some such embodiments, the first alignment mark 210 may be disposed over a TSV 106 of the wafer 200, such as over a contact hole. In yet other embodiments, at least some of the first alignment marks 210 are disposed on scribe lines and at least some of the first alignment marks 210 are disposed over active circuitry.

Figure 3B:
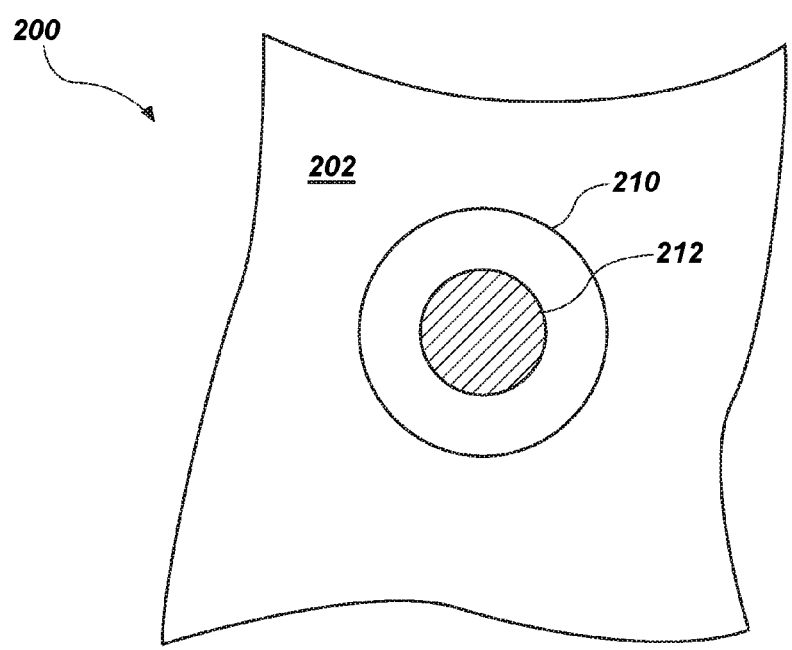

FIG. 3B is a plan view of the wafer 200 after another level (e.g., a second level) has been formed thereon. The second level may be formed by conventional photolithography techniques. Conventional photolithography techniques are known in the art and are therefore, not described in detail herein.

A second alignment mark 212 may be formed over the first alignment mark 210, such as in a photoresist material. In some embodiments, the second alignment mark 212 is formed over a TSV 106 (FIG. 1A, FIG. 1B). The second alignment mark 212 may be used to determine a relative vertical alignment between the first level, on which the first alignment mark 210 is formed, and the second level, on which the second alignment mark 212 is formed. The second alignment mark 212 may be positioned on the wafer 200 at a location corresponding to a location of the first alignment mark 210. In other words, the second alignment mark 212 may be disposed on the second level at a same distance and orientation relative to one or more features on the second level as the first alignment mark 210 is to corresponding one or more features on the first level. In some embodiments, the wafer 200 includes additional alignment marks by which a relative rotational alignment of the wafer 200 with respect to a desired rotational alignment may be determined. By way of nonlimiting example, additional alignment marks may be positioned adjacent a periphery of the wafer 200 and may be used to determine rotational alignment of the wafer 200.

The second alignment mark 212 may include any shape for which a center can be calculated. In some embodiments, the second alignment mark 212 includes a shape that is symmetric about a center thereof, although the disclosure is not so limited. By way of nonlimiting example, the second alignment mark 212 may include a circle, an ellipse, an oval, or polygons such as a square, a rectangle, a pentagon, a hexagon, a heptagon, an octagon, a nonagon, a decagon, etc. In other embodiments, the second alignment mark 212 may include shapes that are asymmetric about a center thereof.

The second alignment mark 212 may be sized and shaped to be disposed within the first alignment mark 210. In other words, substantially all edges that define the second alignment mark 212 may be disposed within a boundary defined by edges that define the first alignment mark 210. A boundary of the second alignment mark 212 may be separated from the first alignment mark 210 such that an imaging tool (e.g., a camera of an optical microscope or of a scanning electron microscope) can sufficiently differentiate between the first alignment mark 210 and the second alignment mark 212.

The second alignment mark 212 may be shaped substantially similar to the first alignment mark 210. In some such embodiments, the first alignment mark 210 may comprise a circle and the second alignment mark 212 may comprise another circle having a diameter smaller than a diameter of the first alignment mark 210. The first alignment mark 210 may have a diameter between about 10 μm and about 30 μm, such as between about 15 μm and about 25 μm and the second alignment mark 212 may have a diameter between about 5 μm and about 20 μm, such as between about 10 μm and about 15 μm.

Although the second alignment mark 212 has been illustrated as being smaller in size (e.g., diameter) than the first alignment mark 210, the disclosure is not so limited. In other embodiments, the first alignment mark 210 may be smaller than the second alignment mark 212 and the first alignment mark 210 may be disposed within the second alignment mark 212.

A relative lateral misregistration between the first level and the second level may be determined by measuring a lateral offset between a center of the first alignment mark 210 and a center of the second alignment mark 212. Since the second alignment mark 212 is formed on the wafer 200 at a position relative to one or more features on the second level that corresponds to a position of the first alignment mark 210 relative to one or more features on the first level, alignment of the first alignment mark 210 and the second alignment mark 212 may be used to align one or more features located on the first level to one or more features located on the second level of the wafer 200. In some embodiments, at least one of the first alignment mark 210 and the second alignment mark 212 is formed over a TSV 106 (FIG. 1A, FIG. 1B). In some such embodiments, a misregistration of the TSV 106 to a current level of the wafer 200 may correspond to the misregistration between the first level and the second level.

Figure 3C:
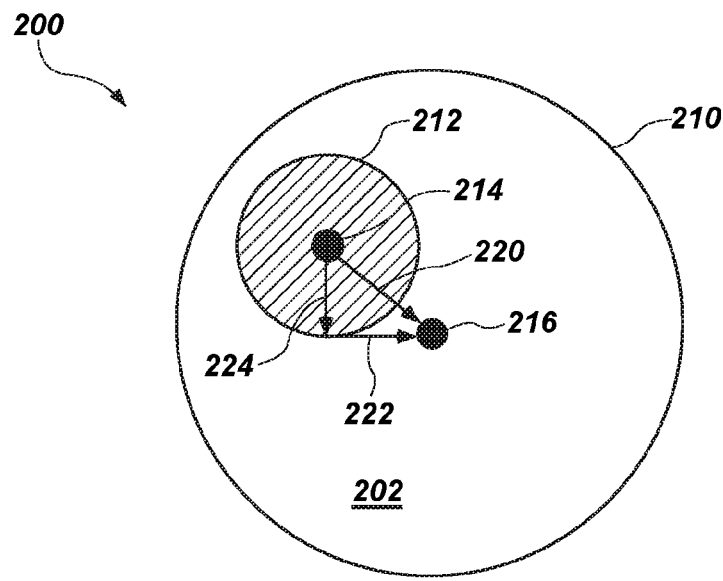

FIG. 3C illustrates a portion of a wafer 200 wherein the second alignment mark 212 is misregistered (i.e., laterally offset) from the first alignment mark 210. In other words, a center 216 of the first alignment mark 210 is misregistered from a center 214 of the second alignment mark 212. A magnitude and direction of the misregistration between the first alignment mark 210 and the second alignment mark 212 may correspond to a misregistration vector 220. The misregistration vector 220 may be defined by a first vector 222 having a direction and magnitude in a first direction (e.g., an x-direction) and a second vector 224 having a direction and magnitude in a second direction, orthogonal to the first direction (e.g., a y-direction).

A determined magnitude and direction of the misregistration vector 220 may be used during the fabrication of future semiconductor wafers 200, for example in the same wafer batch, to account for the misregistration between the first level and the second level. For example, other semiconductor wafers in a batch of semiconductor wafers may be fabricated such that they do not exhibit the misregistration, such as by moving the wafers before photolithography acts in which the misregistered level is formed. By way of nonlimiting example, a photolithography tool may be adjusted (such as a wafer stage of a stepper) to move the wafer stage on which the wafer rests by an amount of the misregistration vector 220 during one or more stages of device fabrication to compensate for the misregistration, such as during formation of one or more of the conductive pads 110 (FIG. 1A, FIG. 1B), the electrically conductive elements 104 (FIG. 1A, FIG. 1B), or the TSVs 106 (FIG. 1A, FIG. 1B).

Accordingly, first alignment marks 210 may be formed in one or more previously formed levels of the wafer 200. At least another level of the wafer 200 may include second alignment marks 212 formed at a location corresponding to a location of the first alignment marks 210 on the one or more previously formed levels. The first alignment marks 210 in one level of the wafer 200 may be used to determine the misregistration between the one or more previously formed levels and the at least another level of the wafer 200.

Figure 3D:
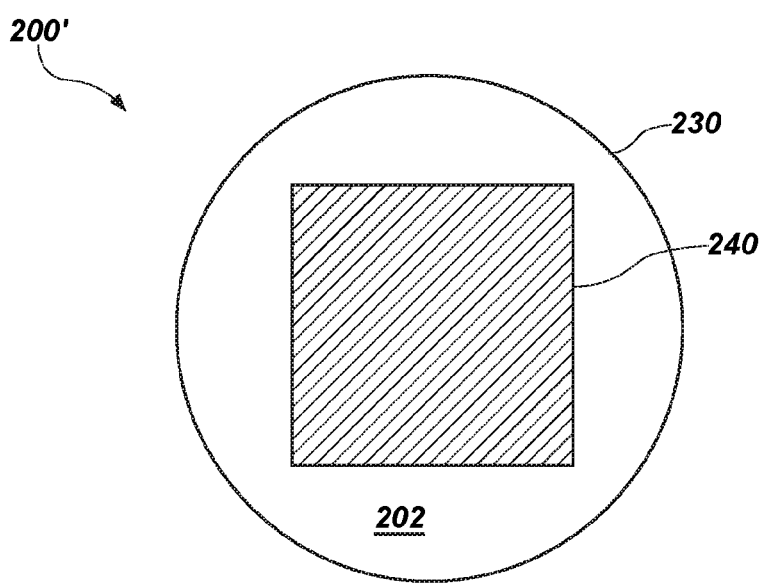

Although FIG. 3C illustrates that the first alignment mark 210 and the second alignment mark 212 each comprise a circle, in other embodiments, the first alignment mark 210 and the second alignment mark 212 may have different shapes. In some embodiments, at least one of the first alignment mark 210 or the second alignment mark 212 comprises a shape other than a circle. Referring to FIG. 3D, another embodiment of a first alignment mark 230 and a second alignment mark 240 on a wafer 200' is illustrated. The first alignment mark 230 may include a circle and the second alignment mark 240 may include a square. The first alignment mark 230 may be disposed on a first level of the wafer 200' and the second alignment mark 240 may be disposed on a second level of the wafer 200'. In some embodiments, each edge of the second alignment mark 240 may have a length between about 5 μm and about 20 μm, such as between about 10 μm and about 15 μm.

Although FIG. 3D illustrates the second alignment mark 240 disposed inside the first alignment mark 230, in other embodiments, the first alignment mark 230 may be disposed inside the second alignment mark 240. In some such embodiments, an outer alignment mark (e.g., the first alignment mark 230) may be a square while an inner alignment mark (e.g., the second alignment mark 240) is a circle. Each edge of the second alignment mark 240 may have a length between about 10 μm and about 30 μm, such as between about 15 μm and about 25 μm.

Figure 4:
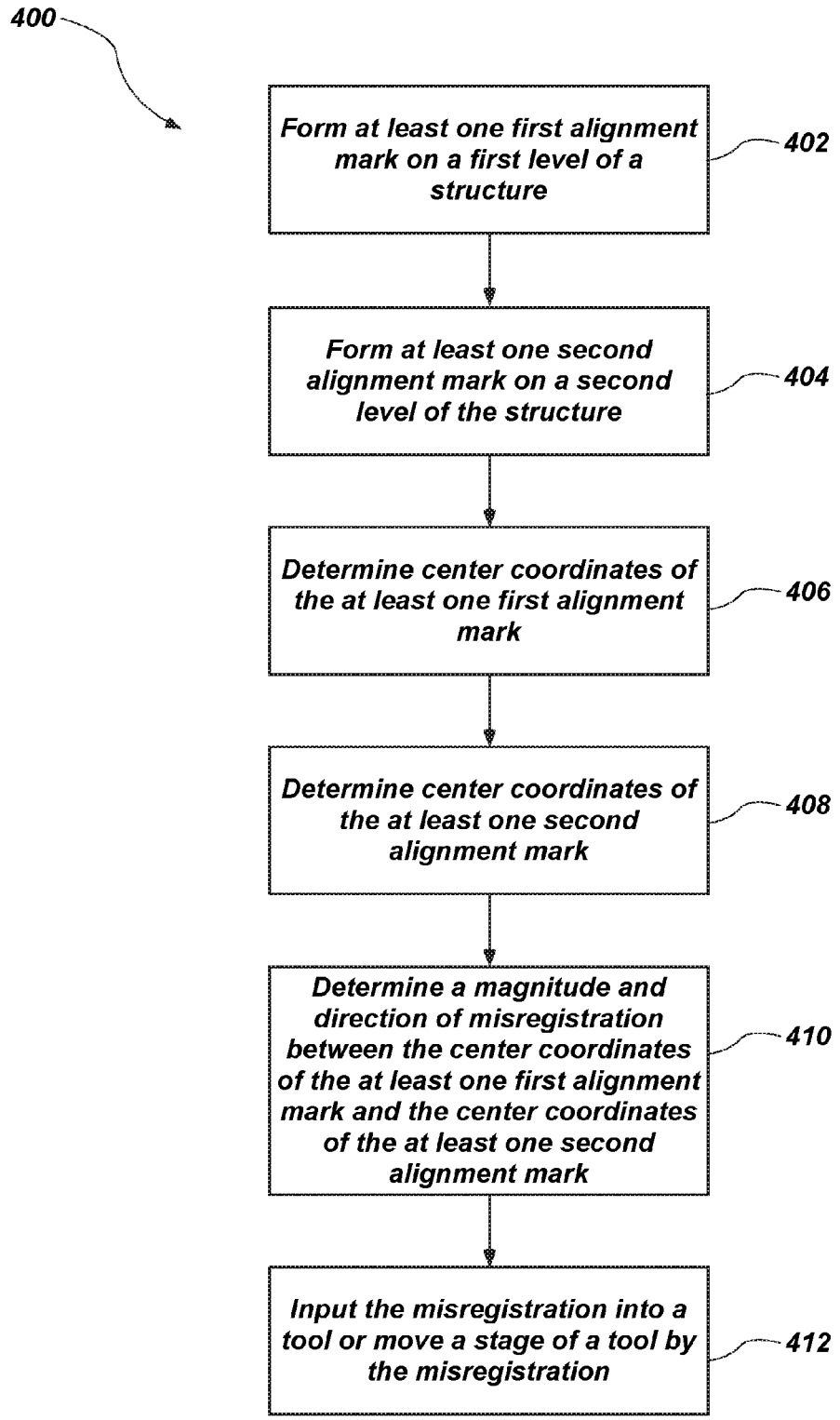
FIG. 4 is a simplified block diagram depicting a method of determining a misregistration between one or more levels of a structure and correcting the misregistration error, according to an embodiment of the disclosure.

FIG. 4 is a simplified block diagram illustrating a method 400 of determining the misregistration (e.g., the misregistration vector 220 (FIG. 3C)) between levels of a structure (e.g., a semiconductor wafer) and correcting the misregistration error, according to an embodiment of the disclosure. The method 400 comprises act 402 including forming at least one first alignment mark on a first level of a structure; act 404 including forming at least one second alignment mark on a second level of the structure; act 406 including determining center coordinates of the at least one first alignment mark; act 408 including determining center coordinates of the at least one second alignment mark; act 410 including determining a magnitude and direction of misregistration between the center coordinates of the at least one first alignment mark and the center coordinates of the at least one second alignment mark; and act 412 including inputting the misregistration into a tool (e.g., a lithography tool) or moving a stage of a tool by the misregistration.

Act 402 includes forming at least one first alignment mark on a first level of a structure. The at least one first alignment mark may be substantially similar to the first alignment mark 210 described above with reference to FIG. 3A through FIG. 3D. The at least one first alignment mark may be formed during formation of circuitry located on the first level of the structure.

Act 404 includes forming at least one second alignment mark in at least a second, different level of the semiconductor wafer. In some embodiments, the second level is adjacent to the first level. In some such embodiments, the at least one second alignment mark is formed over the at least one first alignment mark and is formed substantially within the at least one first alignment mark. In other words, edges that define the at least one second alignment mark may be disposed substantially within an area defined by edges that define the at least one first alignment mark. The at least one second alignment mark may be similar to the second alignment mark described above with reference to FIG. 3B through FIG. 3D. In some embodiments, the at least one second alignment mark has a shape substantially similar to a shape of the at least one first alignment mark. In other embodiments, the at least one second alignment mark has a shape that is different from the shape of the at least one first alignment mark.

Act 406 includes determining center coordinates of the at least one first alignment mark, such as in a metrology tool. In some embodiments, known imaging techniques may be used to determine a location of the at least one first alignment mark. The at least one first alignment mark may be detectable or distinguishable by conventional apparatuses, such as an alignment apparatus in conjunction with cameras equipped with microscopes. By way of nonlimiting example, the at least one first alignment mark may be imaged with an imaging system that includes an optical system, a scanning electron microscope (SEM), a scatterometer, an atomic force microscope (AFM), or another imaging system. In some embodiments, the imaging system includes a microscope and a video camera positioned above the wafer 200 (FIG. 3A). Similarly, the imaging system may include a SEM configured to focus an electron beam toward the wafer 200. The imaging system may be configured to detect contrast between the at least one first alignment mark and at least one second alignment mark.

The imaging system may be configured to capture an image of the wafer 200 and form a digital image of the wafer. The at least one first alignment mark may be defined as a set of points (e.g., pixels), each of which at least partially defines the shape of the at least one first alignment mark. Each of the points defining the at least one first alignment mark may be defined by a set of coordinates (e.g., an x-coordinate and a y-coordinate). In some embodiments, the imaging system may be configured to determine the shape of the at least one first alignment mark using a best fit model with the points that are captured by the imaging tool. In other words, in some embodiments, even though some edges or points that define the at least one first alignment mark may not be imaged (e.g., such as when the wafer 200 includes a thick photoresist having nonuniform surface topography), the imaging tool may be configured to use a best fit model to define edges of the at least one first alignment mark. Using image processing techniques, the imaging system may be configured to determine the coordinates of the points defining the first alignment mark. Image processing techniques are known by those of ordinary skill in the art and are therefore, not described in detail herein.

The center of the first alignment mark may be determined by averaging coordinates of points that define the shape of the at least one first alignment mark. In some embodiments, an x-coordinate (or an x-value) of the center of the at least one first alignment mark may be calculated by averaging x-coordinates of points that define the shape of the at least one first alignment mark and a y-coordinate (or a y-value) of the center may be calculated by averaging y-coordinates of points that define the shape of the at least one first alignment mark. By way of nonlimiting example, an x- and y-coordinate of the center may be determined according to Equation (1) and Equation (2), respectively:

$$x_c = (x_1 + x_2 + x_3 \ldots + x_n)/n \quad (1);$$

$$y_c = (y_1 + y_2 + y_3 \ldots + y_n)/n \quad (2),$$

wherein $x_c$ is the x-coordinate of the center of the first alignment mark, $y_c$ is the y-coordinate of the center of the first alignment mark, $x_1, x_2, x_3, x_n, y_1, y_2, y_3, y_n$, etc., are the x-coordinates and y-coordinates of the individual points that define the first alignment mark, and n is the number of points that are used to determine the center coordinates of the first alignment mark.

In some embodiments, n is equal to at least about least 5, at least about 10, at least about 20, or at least about 25. In some embodiments, the first alignment mark is a circle and n is equal to an integer having a value of 3 or greater. In some such embodiments, the points that define the circle are located at least every about 60° around the circle, such as at least every about 30°, at least every about 15°, or at least every about 10°. In some embodiments, each point used to calculate the center point of the first alignment mark is circumferentially equidistant from adjacent points used to calculate the average. In other words, adjacent points used to calculate the average may be separated from each other by about a same distance.

In other embodiments, the at least one first alignment mark comprises a polygon, each edge of the polygon defined by a same number of points. A center of the polygon may be determined using a same number of points for each side that defines the polygon. By way of nonlimiting example, the alignment mark may comprise a square, each side of which may be defined by a same number of points.

Act 408 includes determining center coordinates of the at least one second alignment mark. The center coordinates of the at least one second alignment mark may be determined in a method substantially similar to the method of determining the center coordinates of the at least one first alignment mark. For example, the imaging system may be configured to form a digital image of the at least one second alignment mark and define the at least one second alignment mark as a set of points, each defined by a set of coordinates. The center coordinates of the at least one second alignment mark may be calculated using Equation (1) and Equation (2), as described above with reference to the method of determining the center coordinates of the at least one first alignment mark.

Act 410 includes determining a magnitude and direction of misregistration between the center of the at least one first alignment mark and the center of the at least one second alignment mark (e.g., the misregistration vector 220 (FIG. 3C)). The misregistration vector may be defined by a misregistration in a first direction and a misregistration in a second, orthogonal direction, according to Equations (3) and (4), respectively, below:

$$x_m = (x_{c1} - x_{c2}) \quad (3);$$

$$y_m = (y_{c1} - y_{c2}) \quad (4),$$

wherein $x_m$ is the misregistration in the first direction (e.g., the x-direction), $x_{c1}$ and $x_{c2}$ are the center x-coordinates of the first and second alignment marks, respectively, $y_m$ is the misregistration in a second direction (e.g., the y-direction), and $y_{c1}$ and $y_{c2}$ are the center y-coordinates of the first and second alignment marks, respectively.

Act 412 includes one of inputting the misregistration into a tool (e.g., a lithography tool) or moving a stage of a tool by the misregistration. In some embodiments, the misregistration may be entered into a stepper or other photolithography tool before remaining wafers of a given lot of wafers are processed. In some such embodiments, a wafer stage of the stepper may be moved in a direction and by a magnitude corresponding to the misregistration prior to a subsequent process act. In other embodiments, responsive to determining that the misregistration is more than a predetermined acceptable value, the wafer may be discarded, or a misregistered level of the wafer may be removed from the wafer surface and the wafer may be reprocessed (e.g., placed back into a lithography tool and patterned to replace the level that was misregistered). In additional embodiments, locations of alignment marks on semiconductor dice may be ascertained in a similar manner, and misregistration between alignment marks on different semiconductor dice to be stacked into an assembly may be input into another tool, such as, for example, a pick-and-place tool, to ensure vertical alignment of, for example, pillars of one semiconductor die with bond pads of an adjacent semiconductor die being stacked to form an assembly.

The methods described herein provide improved methods of measuring misregistration between one or more levels of a semiconductor wafer compared to conventional methods. As noted above, conventional methods of measuring a misregistration include determining a location of edges of an inner box and an outer box based on waveforms produced with an imaging tool, such as an optical microscope or a SEM. However, in some embodiments, photoresist materials may exhibit variations in color and pattern contrast, may be as thick as about 20 μm or more, and may exhibit variations in surface topography that increase a difficulty of determining a location of edges with conventional methods. Such nonuniformities may reduce a capture rate of an imaging tool used to estimate a location of edges of the inner box and the outer box.

By way of contrast, using the methods described herein, a capture rate of the at least one first alignment mark and the at least one second alignment mark may be as high as between about 90% and about 100%. Without wishing to be bound by any particular theory, it is believed that defining edges or points that define the at least one first alignment mark and the at least one second alignment mark improves the capture rate of the imaging tool. The increased capture rate and the method of determining the misregistration based on an average coordinate value of the points that define each of the alignment marks may substantially reduce measurement error and a rate at which tested wafers or wafer batches are discarded for excessive overlay error, increasing overall yield. It is believed that using substantially an entire edge that defines the at least one first alignment mark and the at least one second alignment mark (e.g., such as when the at least one first alignment mark and the at least one second alignment mark comprise circles) increases the accuracy of the misregistration determination. In addition, forming at least one of the first alignment marks or the second alignment marks as a circle may increase a capture rate of the imaging device. For example, even when a portion of the circular alignment mark is not imaged, the imaging tool may be configured to define a remainder of the circular alignment mark using the points that are imaged, such as when a portion of the resist is not uniform in at least one of color and pattern contrast. Such methods may be particularly suitable for determining a misregistration between levels of three-dimensional (3D) structures, such as in 3D integration products (e.g., levels of a Hybrid Memory Cube).

Although the alignment marks have been described herein as being formed in a structure (e.g., a semiconductor wafer), in some embodiments, a reticle of a photolithography tool may include one or more alignment marks corresponding to the alignment marks in the wafer. The alignment marks may be transferred to a level of a semiconductor wafer being processed, such as on a photoresist level overlying the semiconductor wafer. A location of the transferred reticle alignment marks on the top level of the semiconductor wafer may be compared to a location of one or more alignment marks in one or more underlying levels of the wafer. In other words, a pattern on the reticle may be aligned to one or more existing alignment marks (e.g., alignment marks 210 (FIG. 3A) on the wafer 200 (FIG. 3A)) during photolithography processes. A misregistration may be determined according to the methods described herein. Prior to exposing the photoresist, the wafer may be moved by the amount of the misregistration, such as by moving the wafer stage of the photolithography tool.

Accordingly, a method of forming a semiconductor structure comprises forming a digital image of at least one first circular alignment mark on a first level of a structure and at least one second circular alignment mark on a second level of the structure, wherein the at least one first circular mark is defined by a first set of points, each point comprising an x-coordinate and a y-coordinate and the at least one second circular alignment mark is defined by a second set of points, each point comprising an x-coordinate and a y-coordinate, determining an x-coordinate and a y-coordinate of a center of the at least one first circular alignment mark by respectively averaging the x-coordinates of the first set of points and averaging the y-coordinates of the first set of points, determining an x-coordinate and a y-coordinate of a center of the at least one second circular alignment mark by respectively averaging the x-coordinates of the second set of points and averaging the y-coordinates of the second set of points, subtracting the x-coordinate and the y-coordinate of the center of the at least one first circular alignment mark from the respective x-coordinate and y-coordinate of the center of the at least one second circular alignment mark to determine a lateral misregistration between the first level and the second level, and responsive to determining the lateral misregistration, adjusting a location of the first level with respect to the second level by the determined lateral misregistration.

Accordingly, a method of determining a lateral misregistration between levels of a semiconductor structure comprises imaging at least one first alignment mark in a first level of a semiconductor structure and at least one second alignment mark in a second level of the semiconductor structure, forming a digital image of the at least one first alignment mark and the at least one second alignment mark, wherein the at least one first alignment mark is defined by a first set of points, each point defined by an x-value and a y-value and the at least one second alignment mark is defined by a second set of points, each point defined by an x-value and a y-value, averaging the x-values and the y-values of the first set of points to determine a respective x-value and a y-value of a center of the at least one first alignment mark, averaging the x-values and the y-values of the second set of points to determine a respective x-value and a y-value of a center of the at least one second alignment mark, and subtracting the x-value and the y-value of the center of the at least one first alignment mark from the respective x-value and y-value of the at least one second alignment mark to determine a magnitude and direction of misregistration between the first level and the second level of the semiconductor wafer.

Figure 5:
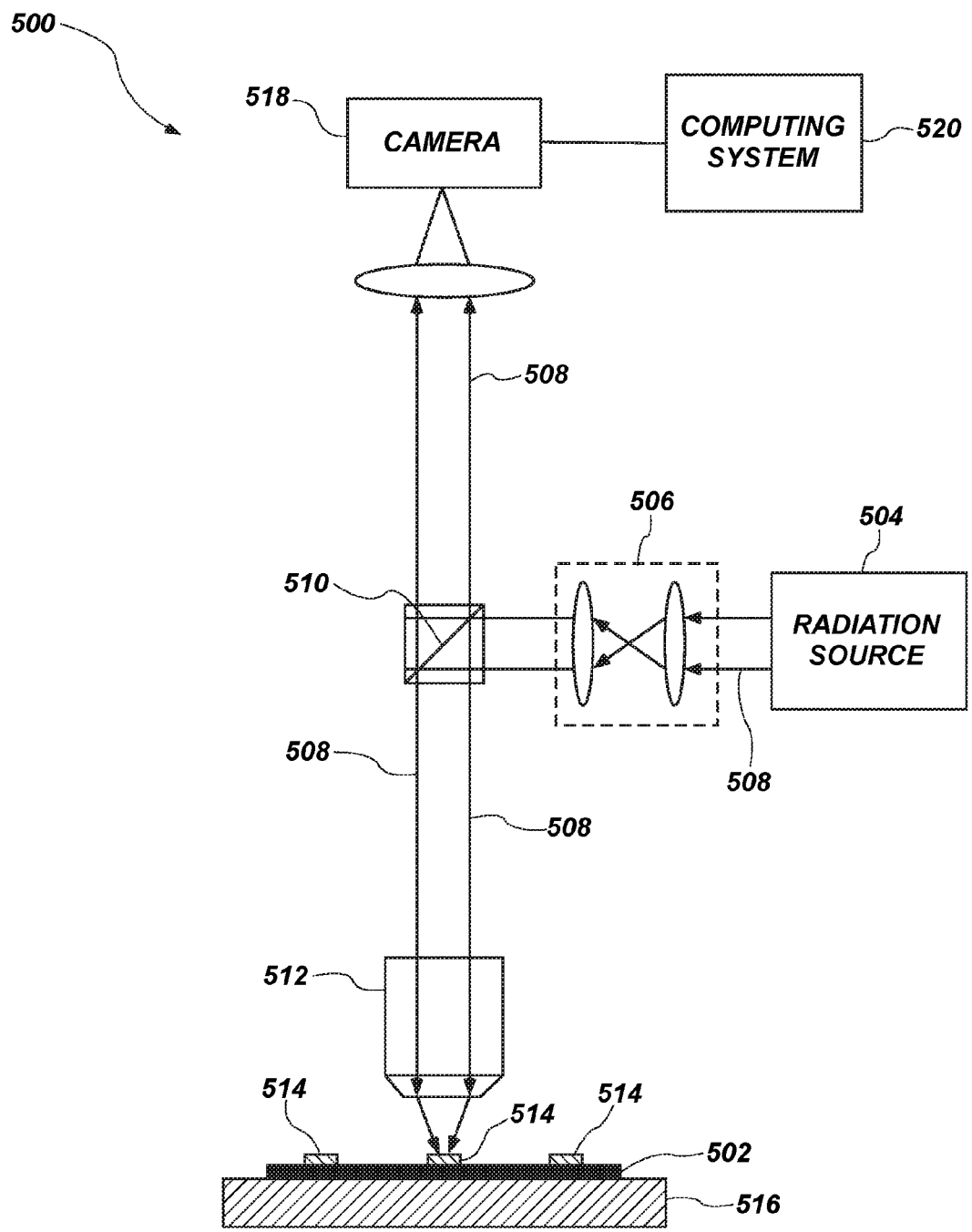
FIG. 5 is a simplified schematic of a metrology tool, according to an embodiment of the disclosure.

In other embodiments, an apparatus, such as a metrology tool, may be configured to determine a magnitude and direction of misregistration between at least one first level of a semiconductor wafer including at least one first alignment mark and at least one second level of the semiconductor wafer including at least one second alignment mark, according to the methods described herein. FIG. 5 is a simplified schematic of an overlay metrology tool 500 configured to determine a misregistration between one or more levels of a semiconductor wafer 502 disposed on a wafer stage 516, according to embodiments of the disclosure. The metrology tool 500 may include a radiation source 504 and a set of optical lenses 506 for directing electromagnetic radiation 508 to a reflective surface 510. The reflective surface 510 may be configured to direct the electromagnetic radiation 508 to an objective lens 512, which may be configured to focus the electromagnetic radiation 508 onto one or more alignment marks 514 on the wafer 502. The one or more alignment marks 514 may be substantially similar to the at least one first alignment mark 210 and the at least one second alignment mark 212 described above with reference to FIG. 3B and FIG. 3C.

A camera 518 may be configured to direct detect electromagnetic radiation 508 scattered by the alignment marks 514 and image the wafer 502. The camera 518 may be operably coupled to a computing system 520 configured to generate a digital image of the wafer 502. The computing system 520 may be configured to determine a center coordinate of each of at least one first alignment mark and at least one second alignment mark, as previously described. Based on the center coordinate of each of the first alignment mark and the second alignment mark, the computing system 520 may be configured to determine a magnitude and direction of misregistration between the first alignment mark and the second alignment mark. The computing system 520 may be operably coupled to a tool and may be configured to input the misregistration into the tool, which may be configured to move, for example, a wafer stage to compensate for the misregistration. In some embodiments, the computing system 520 is configured to transmit values corresponding to the determined misregistration to a pick-and-place tool.

Accordingly, an apparatus comprises a stage configured to carry a semiconductor wafer, the wafer comprising at least one first alignment mark on a first level thereof and at least one second alignment mark on a second level thereof, a camera configured to provide a digital image of the semiconductor wafer defining the at least one first alignment mark with a first set of points, each point of the first set of points defined by an x-value and a y-value and defining the at least one second alignment mark with a second set of points, each point of the second set of points defined by an x-value and a y-value, and a computing system operably coupled to the camera. The computing system is configured to calculate an average of the x-values and the y-values of the first set of points to determine a respective x-value and a y-value of a center of the at least one first alignment mark, calculate an average of the x-values and the y-values of the second set of points to determine a respective x-value and a y-value of a center of the at least one second alignment mark, and subtract the x-value and the y-value of the center of the at least one first alignment mark from the respective x-value and y-value of the center of the at least one second alignment mark to determine a magnitude and direction of misregistration between the first level and the second level of the semiconductor wafer.

Accordingly, an apparatus comprises a stage configured to carry a semiconductor structure comprising at least one alignment mark, a camera configured to provide a digital image of the semiconductor structure defining the at least one alignment mark with a set of points, each point of the set of points defined by an x-value and a y-value, and a computing system operably coupled to the camera. The computing system is configured to calculate an average of the x-values and the y-values of the set of points on a first semiconductor structure to determine a respective x-value and a y-value of a center of the at least one alignment mark thereon, calculate an average of the x-values and the y-values of the set of points on a second semiconductor structure to determine a respective x-value and a y-value of a center of the at least one alignment mark thereon, and subtract the x-value and the y-value of the center of the at least one alignment mark on one of the first and second semiconductor structures from the respective x-value and y-value of the center of the at least one alignment mark on the other of the first and second semiconductor structures to determine a magnitude and direction of misregistration between the first semiconductor structure and the second semiconductor structure.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure as contemplated by the inventors.

What is claimed is:

1. A method of forming a semiconductor structure, the method comprising:
    forming at least one first circular alignment mark at a known distance and orientation relative to electrically conductive elements on a first level of a structure;
    forming at least one second circular alignment mark on a second level of the structure at a location corresponding to a same distance and orientation relative to the electrically conductive elements as the first circular alignment mark;
    forming a digital image of the at least one first circular alignment mark on the first level of the structure and the at least one second circular alignment mark on the second level of the structure, wherein the at least one first circular mark is defined by a first set of points, each point of the first set of points comprising an x-coordinate and a y-coordinate and the at least one second circular alignment mark is defined by a second set of points, each point of the second set of points comprising an x-coordinate and a y-coordinate;
    determining an x-coordinate and a y-coordinate of a center of the at least one first circular alignment mark by respectively averaging the x-coordinates of the first set of points and averaging the y-coordinates of the first set of points;
    determining an x-coordinate and a y-coordinate of a center of the at least one second circular alignment mark by respectively averaging the x-coordinates of the second set of points and averaging the y-coordinates of the second set of points;

subtracting the x-coordinate and the y-coordinate of the center of the at least one first circular alignment mark from the respective x-coordinate and y-coordinate of the center of the at least one second circular alignment mark to determine a lateral misregistration between the first level and the second level; and responsive to determining the lateral misregistration, adjusting a location of the first level with respect to the second level by the determined lateral misregistration to position lateral edges of the first level to be substantially parallel with lateral edges of the second level.

2. The method of claim 1, further comprising forming the at least one second circular alignment mark to have a smaller diameter than a diameter of the at least one first circular alignment mark.

3. The method of claim 2, further comprising forming the at least one second circular alignment mark to be substantially disposed within edges of the at least one first circular alignment mark.

4. The method of claim 1, further comprising:
forming the at least one first circular alignment mark to comprise a diameter between about 10 µm and about 30 µm; and
forming the at least one second circular alignment mark to comprise a diameter between about 5 µm and about 20 µm.

5. The method of claim 1, further comprising forming at least one of the at least one first circular alignment mark or the at least one second circular alignment mark over a through substrate via.

6. The method of claim 1, wherein subtracting the x-coordinate and the y-coordinate of the center of the at least one first circular alignment mark from the respective x-coordinate and y-coordinate of the center of the at least one second circular alignment mark to determine a lateral misregistration comprises:
subtracting the x-coordinate of the center of the at least one first alignment mark from the x-coordinate of the center of the at least one second alignment mark to determine a lateral misregistration in an x-direction; and
subtracting the y-coordinate of the center of the at least one first alignment mark from the y-coordinate of the center of the at least one second alignment mark to determine a lateral misregistration in a y-direction.

7. The method of claim 6, wherein the structure comprises a semiconductor wafer and adjusting a location of the first level with respect to the second level by the determined lateral misregistration comprises:
moving a wafer stage supporting the semiconductor wafer laterally in the x-direction by a magnitude corresponding to the misregistration in the x-direction; and
moving the wafer stage laterally in the y-direction by a magnitude corresponding to the misregistration in the y-direction.

8. The method of claim 1, wherein forming a digital image of at least one first circular alignment mark comprises defining the at least one first circular alignment mark with at least 3 points.

9. The method of claim 1, further comprising selecting each point of the first set of points to be separated from an adjacent point of the first set of points by about a same distance.

10. The method of claim 1, wherein:
forming at least one second circular alignment mark on a second level of the structure at a location corresponding to a same distance and orientation relative to the electrically conductive elements as the first circular alignment mark comprises forming the at least one second circular alignment mark on a photoresist material; and
adjusting a location of the first level with respect to the second level by the determined lateral misregistration comprises moving the structure by the determined lateral misregistration prior to exposing the photoresist material.

11. The method of claim 1, wherein forming at least one first circular alignment mark at a known distance and orientation relative to electrically conductive elements on a first level of a structure comprises forming the at least one first circular alignment mark on active regions of the structure.

12. A method of forming a semiconductor structure, the method comprising:
imaging at least one first alignment mark in a first level of a semiconductor structure and at least one second alignment mark in a second level of the semiconductor structure;
forming a digital image of the at least one first alignment mark and the at least one second alignment mark, wherein the at least one first alignment mark is defined by a first set of points, each point of the first set of points defined by an x-value and a y-value and the at least one second alignment mark is defined by a second set of points, each point of the second set of points defined by an x-value and a y-value;
averaging the x-values and the y-values of the first set of points to determine a respective x-value and a y-value of a center of the at least one first alignment mark;
averaging the x-values and the y-values of the second set of points to determine a respective x-value and a y-value of a center of the at least one second alignment mark;
subtracting the x-value and the y-value of the center of the at least one first alignment mark from the respective x-value and y-value of the center of the at least one second alignment mark to determine a magnitude and direction of misregistration between the first level and the second level of the semiconductor wafer; and
moving a stage of a photolithography tool by an amount corresponding to the misregistration during formation of one or more electrically conductive elements of the semiconductor structure.

13. The method of claim 12, further comprising defining the at least one first alignment mark with a first set of points comprising at least a plurality of points.

14. The method of claim 12, wherein averaging the x-values and the y-values of the first set of points comprises averaging the x-values and the y-values of a plurality of points that define a circle, each of the points separated from a circumferentially adjacent point by about a same distance.

15. The method of claim 12, further comprising selecting the at least one first alignment mark and the at least one second alignment mark to each comprise a circle.

16. The method of claim 12, further comprising selecting the at least one first alignment mark to comprise a circle and the at least one second alignment mark to comprise a square.

17. The method of claim 16, further comprising selecting the at least one first alignment mark to be disposed within the at least one second alignment mark.

18. The method of claim 16, further comprising selecting the at least one second alignment mark to be disposed within the at least one first alignment mark.

19. The method of claim 16, wherein forming a digital image of the at least one first alignment mark and the at least one second alignment mark comprises forming a digital image of at least one square, sides of the at least one square defined by a same number of points as other sides of the at least one square.

20. An apparatus, comprising:
a stage configured to carry a semiconductor wafer, the wafer comprising at least one first alignment mark located a known distance and orientation relative to electrically conductive elements on a first level of the wafer and at least one second alignment mark on a second level thereof and located at a location corresponding to a same distance and orientation relative to the electrically conductive elements as the at least one first alignment mark;
a camera configured to provide a digital image of the semiconductor wafer defining the at least one first alignment mark with a first set of points, each point of the first set of points defined by an x-value and a y-value and defining the at least one second alignment mark with a second set of points, each point of the second set of points defined by an x-value and a y-value; and
a computing system operably coupled to the camera, the computing system configured to:
calculate an average of the x-values and the y-values of the first set of points to determine a respective x-value and a y-value of a center of the at least one first alignment mark;
calculate an average of the x-values and the y-values of the second set of points to determine a respective x-value and a y-value of a center of the at least one second alignment mark; and
subtract the x-value and the y-value of the center of the at least one first alignment mark from the respective x-value and y-value of the center of the at least one second alignment mark to determine a magnitude and direction of misregistration between the first level and the second level of the semiconductor wafer;
wherein the stage is configured to move at least one of the first level and the second level with respect to the other of the first level and the second level to position lateral edges of the first level to be substantially parallel to lateral edges of the second level.

21. The apparatus of claim 20, wherein the computing system is further configured to transmit values corresponding to the determined misregistration to a wafer stage of a lithography tool before remaining wafers in a lot of wafers are processed.

22. The apparatus of claim 20, wherein the computing system is configured to determine the misregistration when the at least one first alignment mark comprises a shape and the at least one second alignment mark comprises a different shape.

23. An apparatus, comprising:
a stage configured to carry a semiconductor structure comprising at least one alignment mark having a circular shape;
a camera configured to provide a digital image of the semiconductor structure defining the at least one alignment mark with a set of points, each point of the set of points defined by an x-value and a y-value;
a computing system operably coupled to the camera, the computing system configured to:
calculate an average of the x-values and the y-values of the set of points defining at least one alignment mark on a first semiconductor structure to determine a respective x-value and a y-value of a center of the at least one alignment mark thereon;
calculate an average of the x-values and y-values of a set of points defining at least one alignment mark on a second semiconductor structure to determine a respective x-value and a y-value of a center of the at least one alignment mark thereon;
subtract the x-value and the y-value of the center of the at least one alignment mark on one of the first and second semiconductor structures from the respective x-value and y-value of the center of the at least one alignment mark on the other of the first and second semiconductor structures to determine a magnitude and direction of misregistration between the first semiconductor structure and the second semiconductor structure; and
communicate with a photolithography tool to move a stage of the photolithography tool by an amount corresponding to the misregistration during formation of one or more electrically conductive elements of the semiconductor structure.

24. The apparatus of claim 23, wherein the computing system is further configured to transmit values corresponding to the determined misregistration to a pick-and-place tool.

25. The apparatus of claim 20, wherein the computing system is configured to determine the misregistration when the at least one first alignment mark comprises a shape and the at least one second alignment mark comprises a different shape.

* * * * *

UNITED STATES PATENT AND TRADEMARK OFFICE
CERTIFICATE OF CORRECTION

PATENT NO. : 9,754,895 B1
APPLICATION NO. : 15/062452
DATED : September 5, 2017
INVENTOR(S) : Yang Chao et al.

It is certified that error appears in the above-identified patent and that said Letters Patent is hereby corrected as shown below:

In the Specification

Column 3, Line 35, change "includes foil ling" to --includes forming--
Column 5, Line 43, change "fainted at any" to --formed at any--

Signed and Sealed this
Seventh Day of November, 2017

Joseph Matal
*Performing the Functions and Duties of the*
*Under Secretary of Commerce for Intellectual Property and*
*Director of the United States Patent and Trademark Office*